(12) United States Patent
Rao (10) Patent No.: US 9,190,502 B2
(45) Date of Patent: *Nov. 17, 2015

(54) SEMICONDUCTOR DEVICES WITH GRADED DOPANT REGIONS

(71) Applicant: G. R. Mohan Rao, Allen, TX (US)

(72) Inventor: G. R. Mohan Rao, Allen, TX (US)

(73) Assignee: Greenthread, LLC, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/515,584

(22) Filed: Oct. 16, 2014

(65) Prior Publication Data

US 2015/0035004 A1 Feb. 5, 2015

Related U.S. Application Data

(60) Continuation of application No. 13/854,319, filed on Apr. 1, 2013, now abandoned, which is a continuation of application No. 11/622,496, filed on Jan. 12, 2007, now Pat. No. 8,421,195, which is a division of application No. 10/934,915, filed on Sep. 3, 2004, now abandoned.

(51) Int. Cl.
| | |
|---|---|
| *H01L 21/02* | (2006.01) |
| *H01L 29/739* | (2006.01) |
| *H01L 27/115* | (2006.01) |
| *H01L 29/36* | (2006.01) |
| *H01L 27/02* | (2006.01) |
| *H01L 27/108* | (2006.01) |

(52) U.S. Cl.
CPC ...... *H01L 29/7395* (2013.01); *H01L 27/11521* (2013.01); *H01L 27/11524* (2013.01); *H01L 29/36* (2013.01); *H01L 27/0214* (2013.01); *H01L 27/10844* (2013.01)

(58) Field of Classification Search
CPC .................................................. H01L 29/7395
USPC ........................................................... 438/37
See application file for complete search history.

(56) References Cited

U.S. PATENT DOCUMENTS

| 4,160,985 A * | 7/1979 | Kamins et al. ................. 257/443 |
| 2001/0040622 A1 * | 11/2001 | Maruyama ....................... 348/64 |
| 2003/0030488 A1 * | 2/2003 | Hueting et al. ................. 330/57 |

* cited by examiner

*Primary Examiner* — Ajay K Arora
(74) *Attorney, Agent, or Firm* — Howison & Arnott, LLP (57) ABSTRACT

Most semiconductor devices manufactured today, have uniform dopant concentration, either in the lateral or vertical device active (and isolation) regions. By grading the dopant concentration, the performance in various semiconductor devices can be significantly improved. Performance improvements can be obtained in application specific areas like increase in frequency of operation for digital logic, various power MOSFET and IGBT ICS, improvement in refresh time for DRAM's, decrease in programming time for nonvolatile memory, better visual quality including pixel resolution and color sensitivity for imaging ICs, better sensitivity for varactors in tunable filters, higher drive capabilities for JFET's, and a host of other applications.

12 Claims, 10 Drawing Sheets

CMOS Substrate for a DRAM or image sensor, with one embodiment of the invention

FIGURE 3(a) Prior art (Twin well CMOS) for a CMOS integrated circuit

FIGURE 3(b) Prior art for a two-device EEPROM memory cell

FIGURE 3(c) Prior art for a 1T-1C DRAM memory cell

FIGURE 3(d) Prior art for a NAND flash memory cell

Note: Control/Sect transistors have a single insulator - traditional MOS transistor.
Storage nodes have a stacked gate structure, typically with a floating gate and control gate comprising the stack.

FIGURE 4 A dopant - concentration grinded drift region in a IGBT

FIGURE 5(a) A CMOS Substrate for digital, mixed, signal, and senors IC's

FIGURE 5(b) CMOS Substrate for a DRAM or image sensor, with one embodiment of the invention FIGURE 5(c)  CMOS Substrate for a NAND flash device to improve programming times

SEMICONDUCTOR DEVICES WITH GRADED DOPANT REGIONS

CROSS-REFERENCE TO RELATED APPLICATION

This continuation application claims priority to and the benefit of U.S. application Ser. No. 13/854,319, filed on Apr. 1, 2013, which is a continuation of U.S. application Ser. No. 11/622,496, filed Jan. 12, 2007, now U.S. Pat. No. 8,421,195, which is a divisional of U.S. application Ser. No. 10/934,915, filed on Sep. 3, 2004, now abandoned, all of which are incorporated by reference.

FIELD OF INVENTION

This present invention relates to all semiconductor devices and systems. Particularly it applies to diffused diodes, avalanche diodes, Schottky devices, power MOS transistors, JFET's, RF bipolar transistors, IGBTs (Insulated Gate Bipolar Transistors), varactors, digital VLSI, mixed signal circuits and sensor devices including camera ICs employing CCD (Charge Coupled Device) as well as CMOS technologies.

BACKGROUND OF INVENTION

Figure 1:
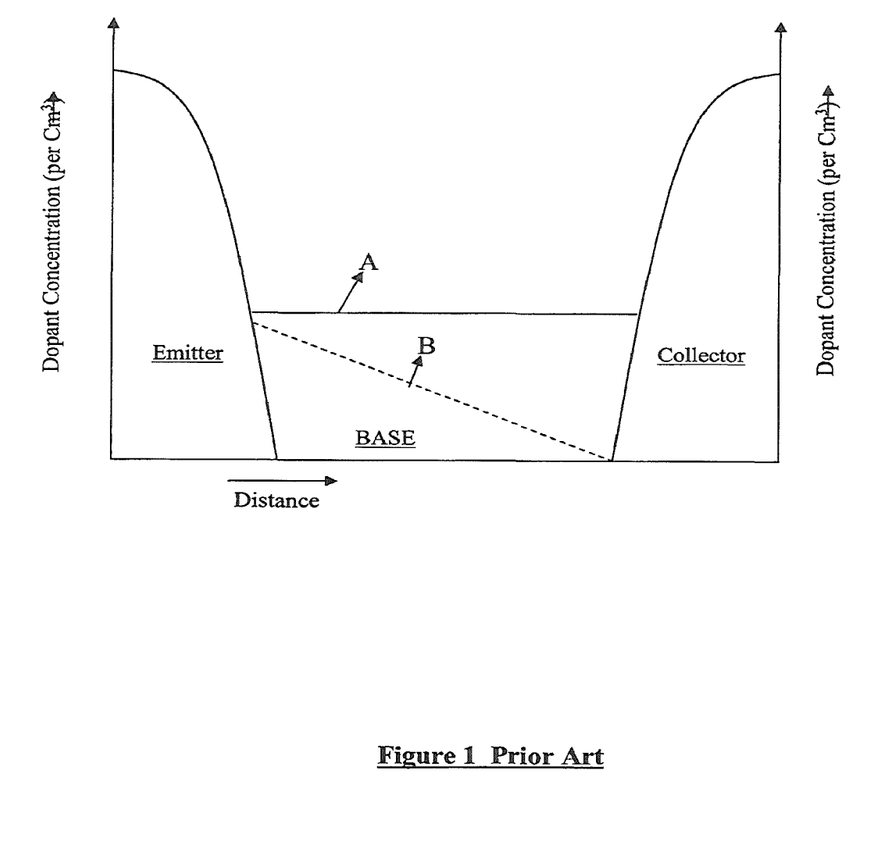
FIG. 1 illustrates the relative doping profiles of emitter, base, and collector, for the two most popular bipolar junction transistors: namely, A—uniform base, and B—graded base.
Figure 2:
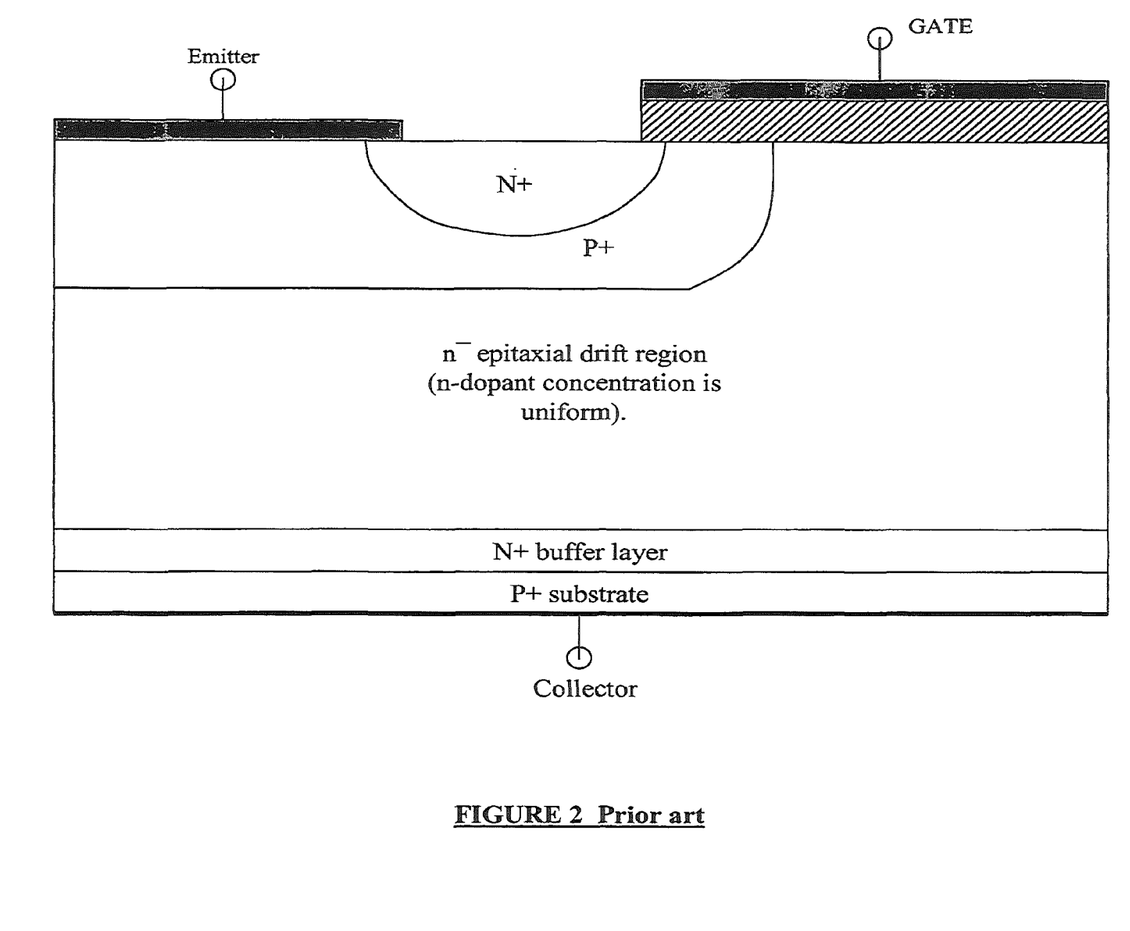
FIG. 2 illustrates the cross section of a commercial IGBT with a uniform epitaxial drift region (base)

Bipolar Junction transistors (BJT) are minority carrier devices as the principle device conduction mechanism. However, majority carriers also a small yet finite role in modulating the conductivity in BJTs. Consequently, both carriers (electrons and holes) play a role in the switching performance of BJTs. The maximum frequency of operation in BJTs is limited by the base transit time as well as the quick recombination of the majority carriers when the device is switched off (prior to beginning the next cycle). The dominant carrier mechanism in BJTs is carrier diffusion. Carrier drift current component is fairly small, especially in uniformly doped base BJTs. Efforts have been made in graded base transistors to create an 'aiding drift field', to enhance the diffusing minority carrier's speed from emitter to collector. However, most semiconductor devices, including various power MOSFETs (traditional, DMOS, lateral, vertical and a host of other configurations), IGBT's (Insulated Gated Base Transistors), still use a uniformly doped drift epitaxial region in the base. FIG. 1 shows the relative doping concentration versus distance in a BJT. FIG. 2 shows the 'uniformly doped epi region' in a IGBT. In contrast to BJTs, MOS devices are majority carrier devices for conduction. The conduction is channel dominated. The channel can be a surface in one plane in planar devices. The surface can also be on the sidewalls in a vertical device. Other device architectures to combine planar and vertical conductions are also possible. The maximum frequency of operation is dictated primarily by source-drain separation distance. Most MOS devices use a uniformly doped substrate (or a well region). When a MOSFET is optimally integrated with a BJT in a monolithic fashion, an IGBT results. The IGBT inherits the advantages of both MOSFET and BJT. It also brings new challenges because the required characteristics (electron transit and hole recombination as fast as possible in the case of an n-channel IGBT) require different dopant gradients either in the same layer at different positions, or at the interfaces of similar or dissimilar layers.

Figure 3A:
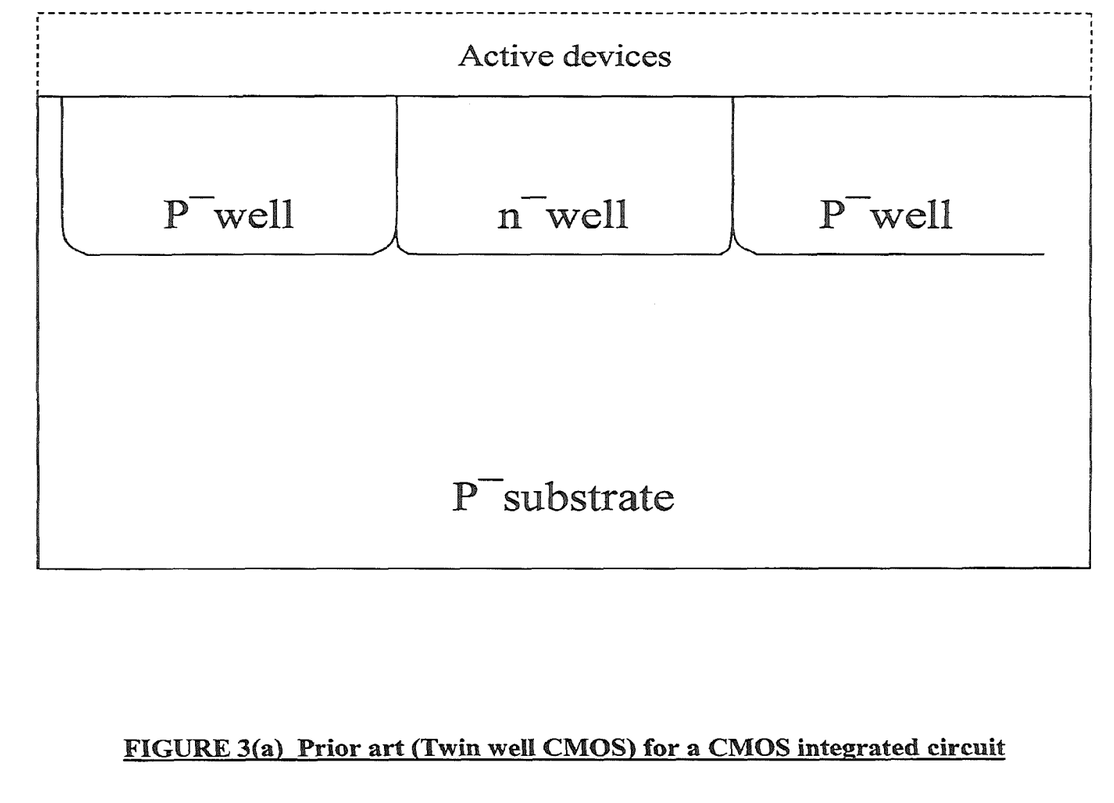
FIGS. 3(a), 3(b), 3(c), 3(d) illustrate cross sections commonly used CMOS silicon substrate with two wells (one n-well in which p-channel transistors are subsequently fabricated, and, one p-well in which n-channel transistors are subsequently fabricated)—typical IC, EEPROM using tunnel insulator, DRAM and NAND flash.
Figure 3B:
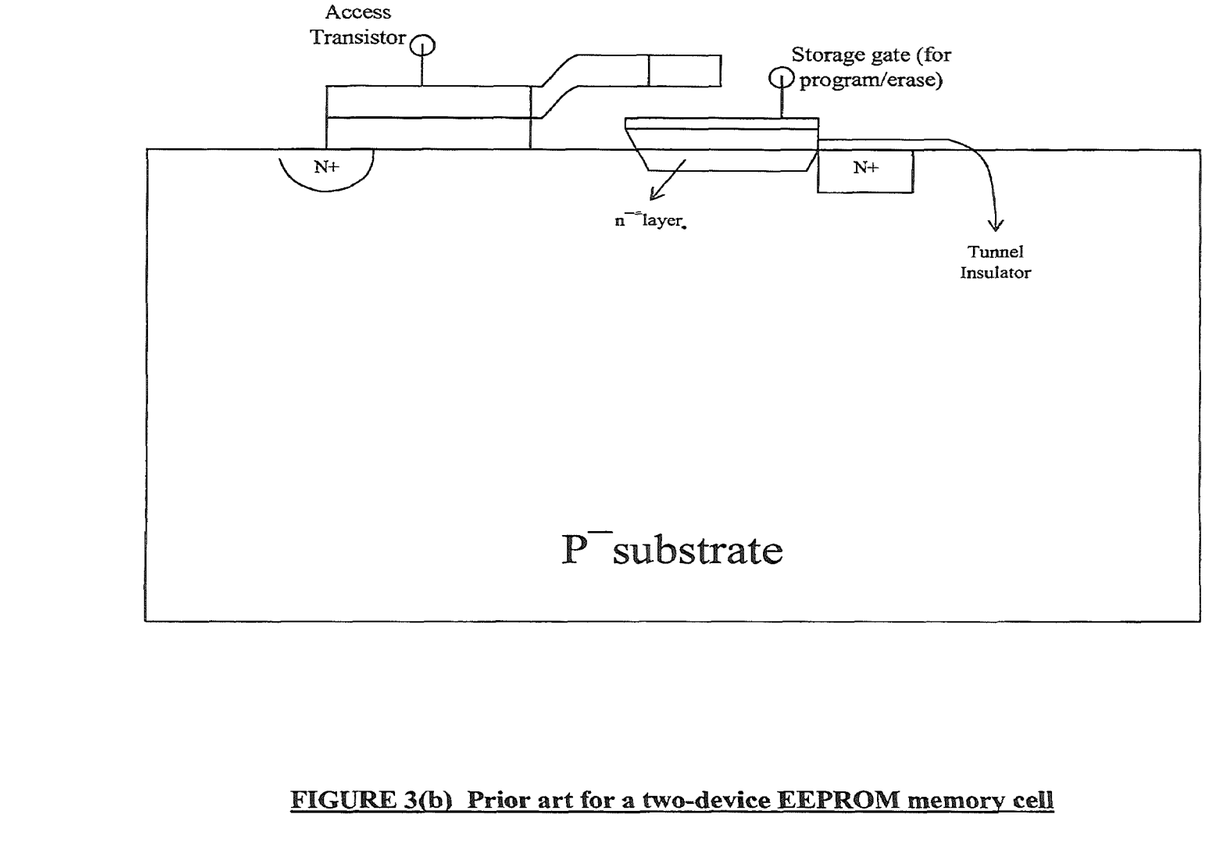
Figure 3C:
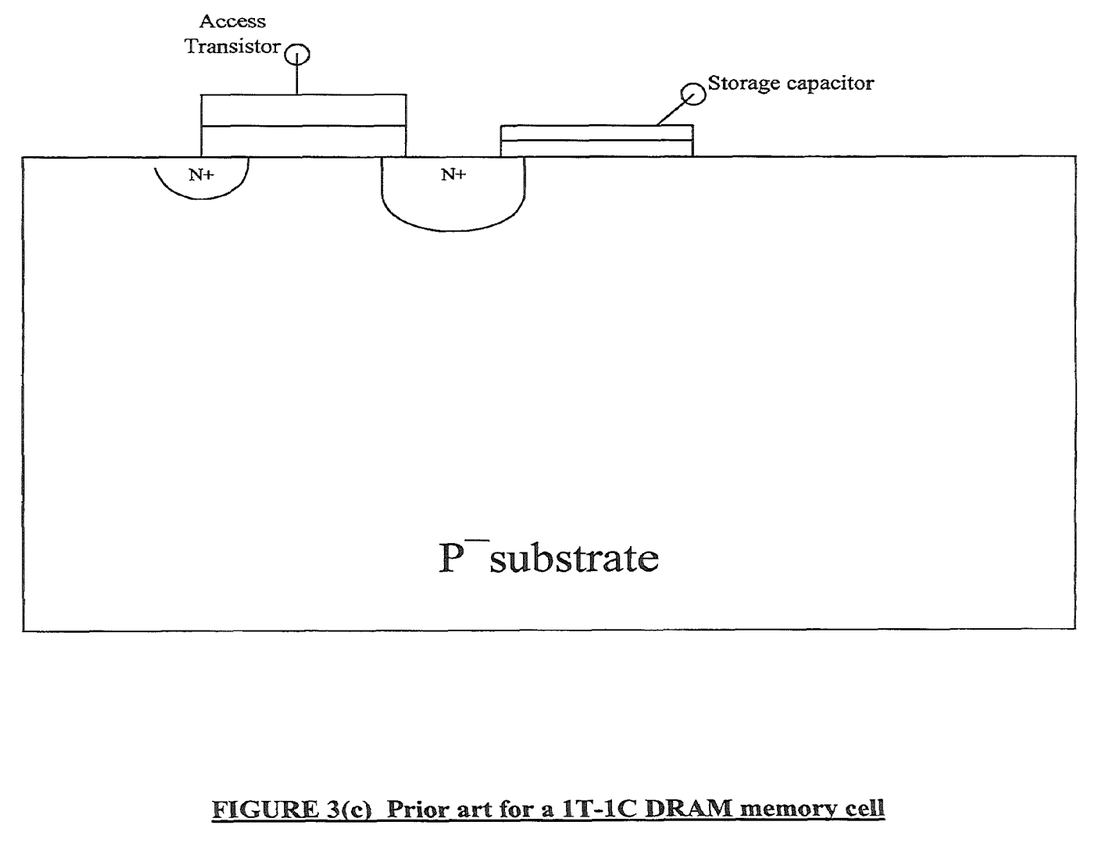
Figure 3D:
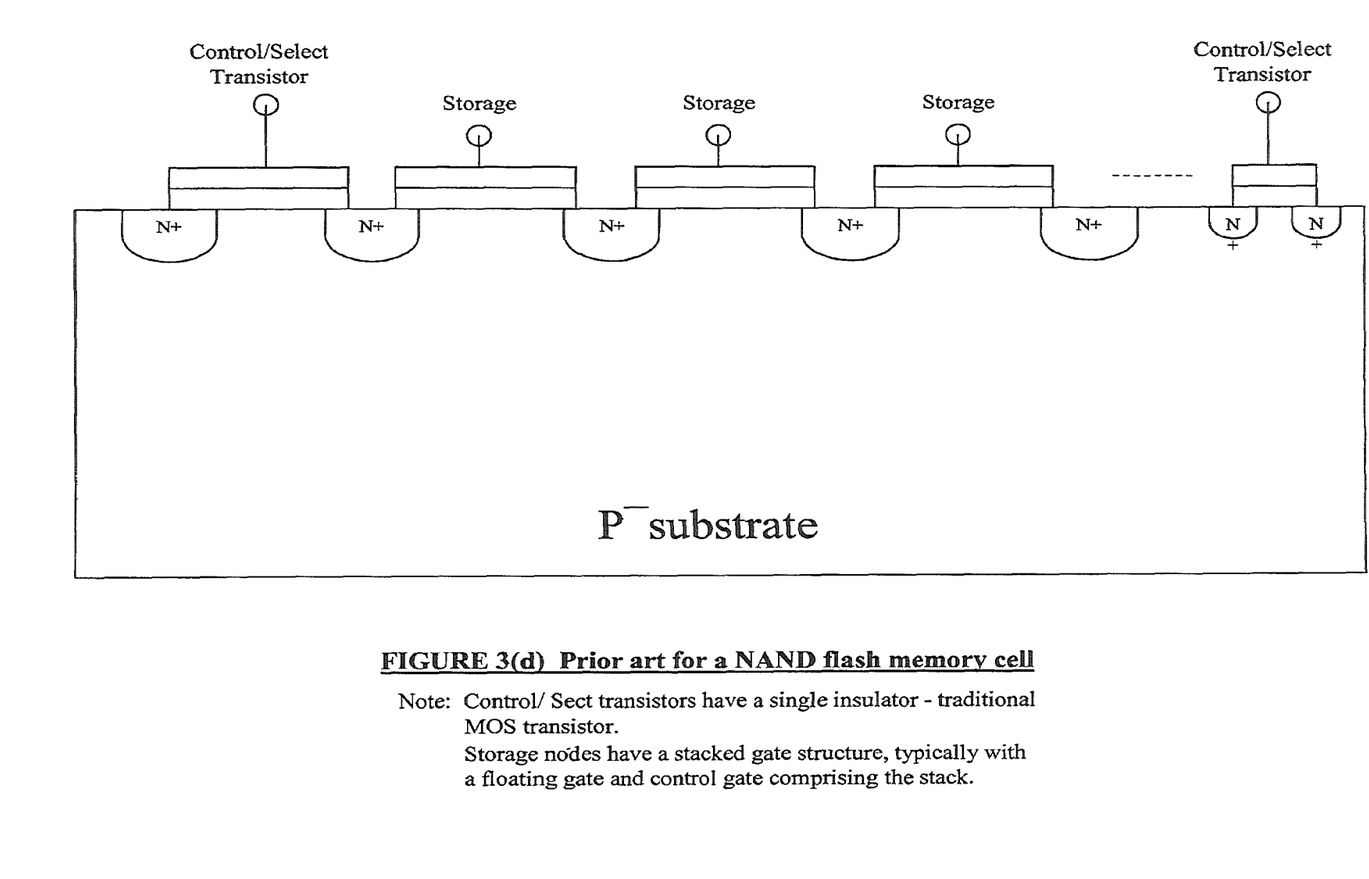

'Retrograde' wells have been attempted, with little success, to help improve soft error immunity in SRAM's and visual quality in imaging circuits. FIG. 3(a) shows a typical CMOS VLSI device employing a twin well substrate, on which active devices are subsequently fabricated. FIGS. 3(b), 3(c), and 3(d) illustrate device cross sections, as practiced today. 'Retrograde' and 'halo' wells have also been attempted to improve refresh time in DRAM's (dynamic random access memories), as well as, reducing dark current (background noise) and enhance RGB (Red, Green, Blue) color resolution in digital camera Ics. Most of these techniques either divert the minority carriers away form the active regions of critical charge storage nodes at the surface, or, increase minority carrier density locally as the particular application requires.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

The relative doping concentrations of emitter and collector regions varies from $10^{18}$ to $10^{20}$/cm$^3$, where as the base region is $10^{14}$ to $10^{16}$/cm$^3$ depending on the desired characteristics of the BJT. In graded base p-n-p transistors, the donor dopant concentration may be 10 to 100× at the emitter-base junction, relative to the base-collector junction (1×). The gradient can be linear, quasi linear, exponential or complimentary error function. The relative slope of the donor concentration throughout the base, creates a suitable aiding drift electric field, to help the holes (p-n-p transistor) transverse from emitter to collector. Since the aiding drift field helps hole conduction, the current gain at a given frequency is enhanced, relative to a uniformly-doped-(base) BJT. The improvement in cut-off frequency (or, frequency at unity gain, $f_T$) can be as large as 2×-5×. Similar performance improvements are also applicable to n-p-n transistors.

Figure 4:
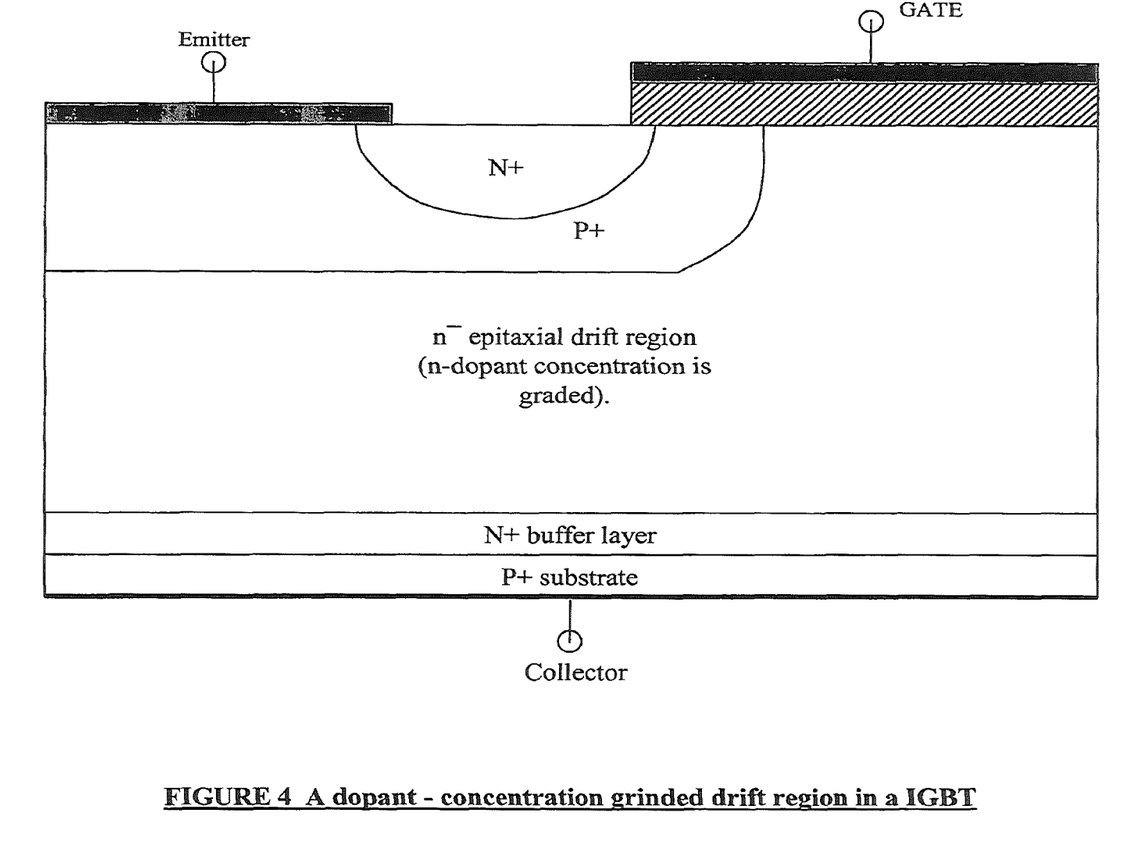
FIG. 4 illustrates the cross section of a IGBT, using one embodiment of the invention described here, where the dopant is optimally graded in the eptaxial drift region.

As illustrated in FIG. 4, in one embodiment according to the invention, a donor gradient is established from the emitter-drift epitaxial base region junction of the punch-through IGBT, to the drift epitaxial base region—n$^r$ buffer layer boundary (electrons in this case are accelerated in their transit from emitter to collector). The 'average' base resistance is optimized, so that conductivity modulation and lifetime (for minority carriers) in base region are not compromised. By sweeping the carriers towards the n' buffer region two advantages are obtained—the frequency of operation (combination of $t_{on}$ and $t_{off}$ as is known in the IGBT commercial nomenclature) can be enhanced. More importantly, during $t_{off}$, holes can be recombined much quicker at the n$^r$ buffer layer, compared to a uniformly doped n⁻ epitaxial drift region by establishing a different dopant gradient near the n+ buffer layer. It should be noted that the drift region can also be a non-epitaxial silicon substrate. Epitaxy enhances lifetime, but, epitaxy is not mandatory. Different layers of dopan regions can be transferred through wafer to wafer bonding (or other similar transfer mechanisms) for eventual device fabrication. The "reverse recovery time" for an IGBT is significantly improved due to the optimized graded dopant in the so called "drift region" as well as at the interfaces of the drift region. Graded dopants can also be implemented in the n+ buffer layer as well as other regions adjacent to the respective layers. Two important performance enhancements are the result of dopant gradients. For example, in an n-channel IGBT, electrons can be swept from source to drain rapidly, while at the same time holes can be recombined closer to the n+ buffer layer. This can improve t(on) and t(off) in the same device.

Figure 5A:
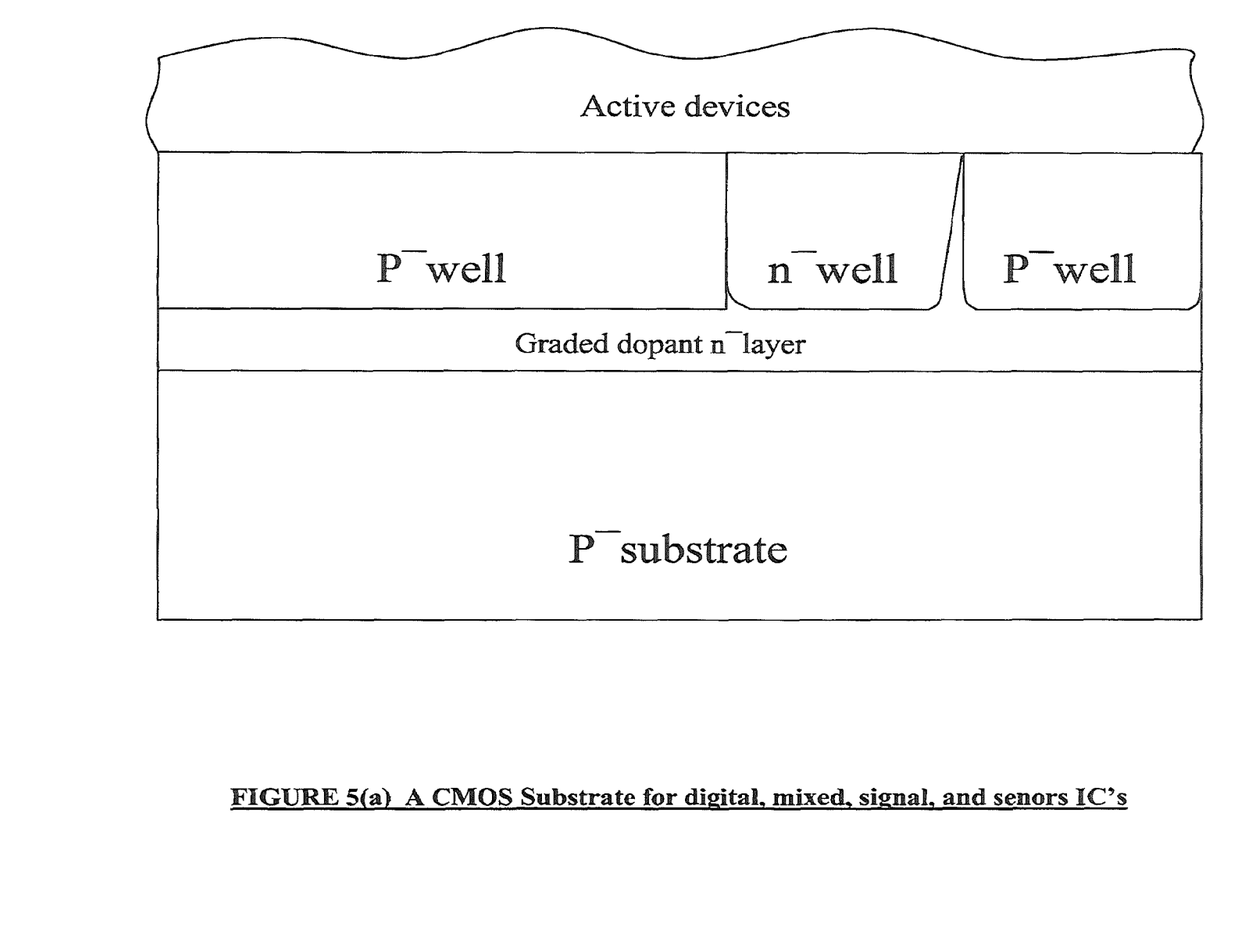
FIGS. 5(a), 5(b), 5(c) illustrate the cross sections of a MOS silicon substrate with two wells, and, an underlying layer using embodiments of the invention to improve performance in each application—VLSI logic, DRAM/image IC, nonvolatile memory IC.
Figure 5B:
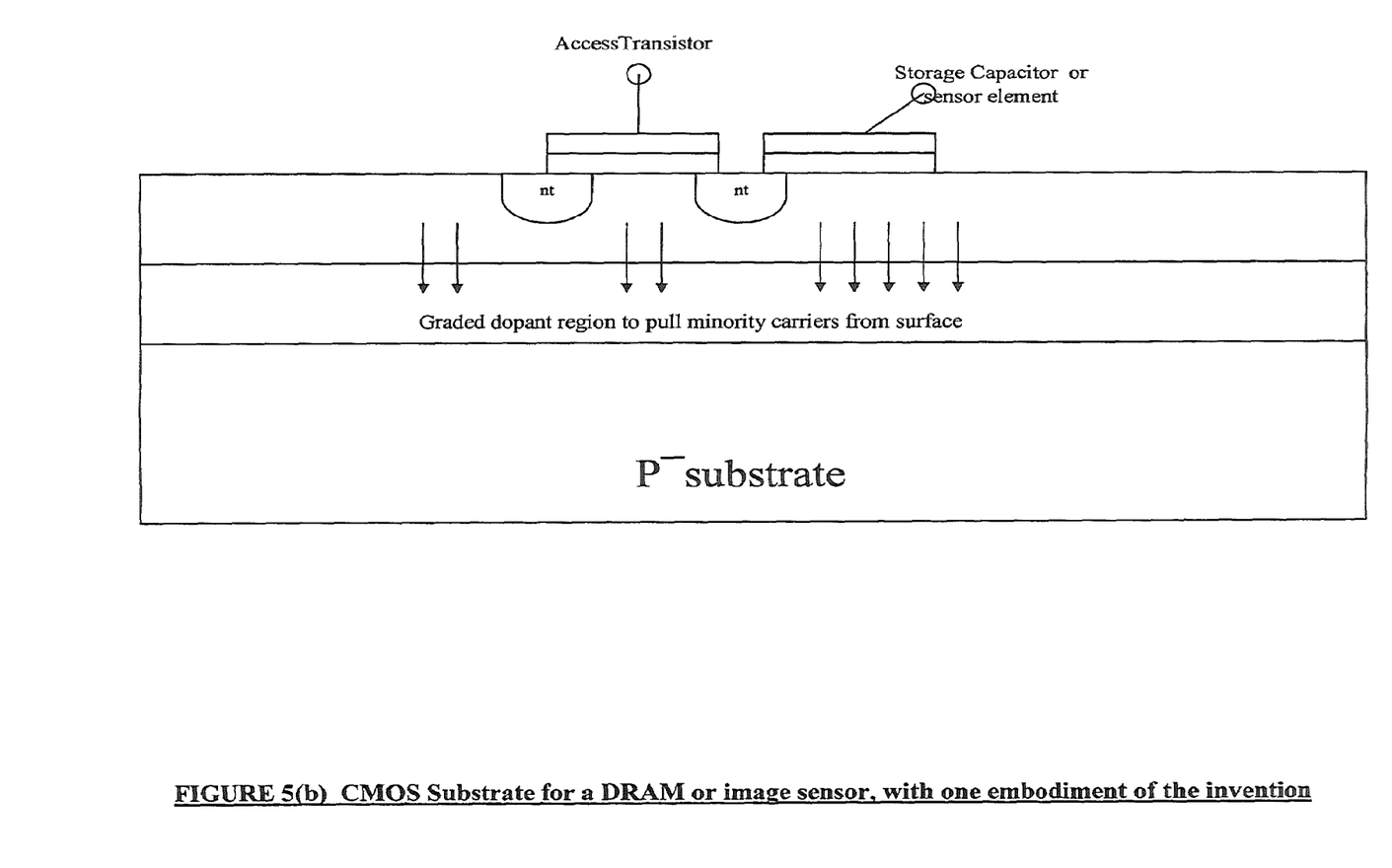
Figure 5C:
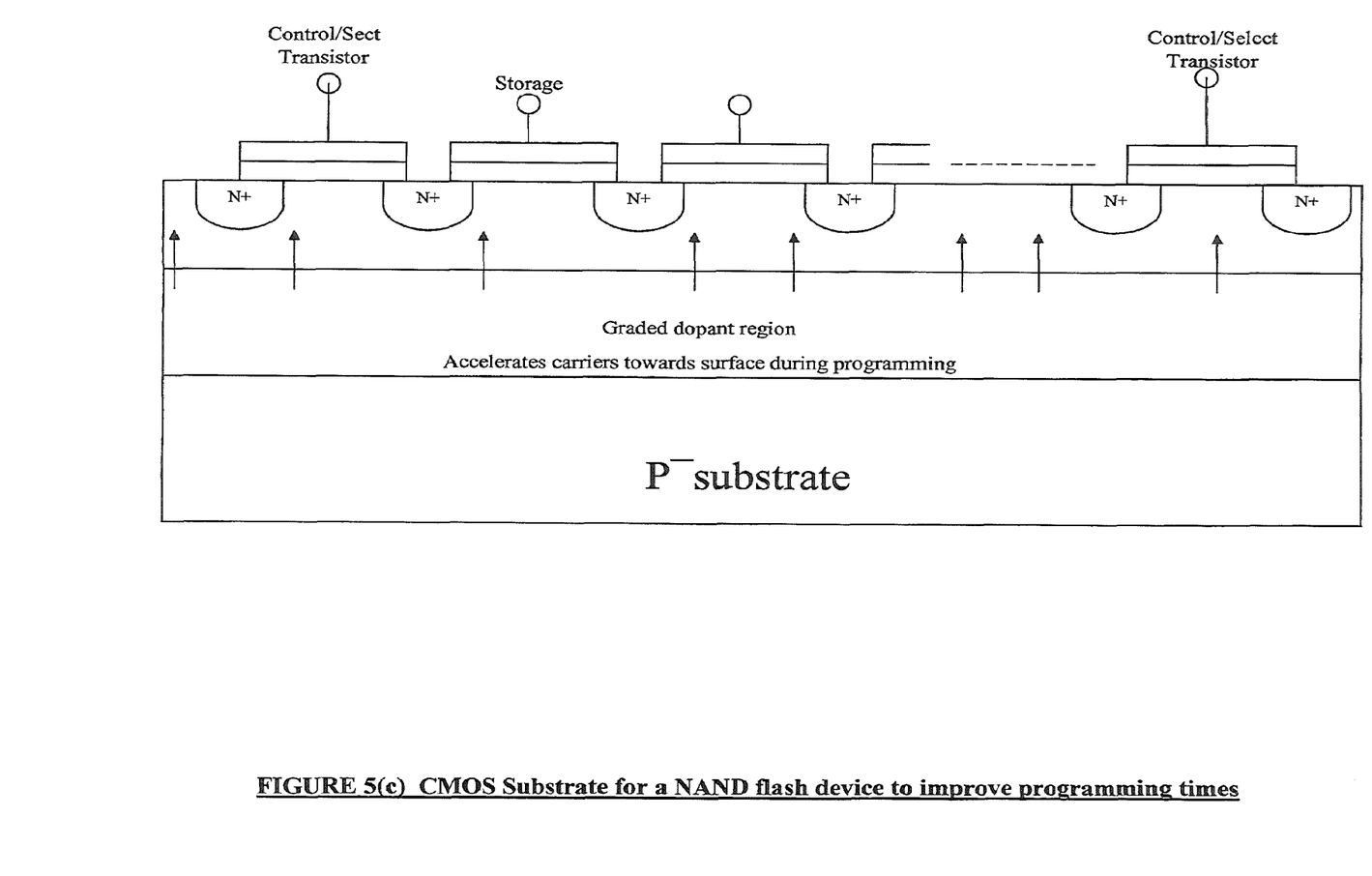

The following paragraph, beginning on page 5, line 6, and ending on page 11, line 28, is amended as indicated in the marked up version below:

As illustrated in FIGS. 5(a), 5(b), 5(c), donor gradient is also of benefit to very large scale integrated circuits (VLSI)—VLSI logic, DRAM, nonvolatile memory like NAND flash. Spurious minority carriers can be generated by clock switching in digital VLSI logic and memory IC'S. These unwanted carriers can discharge dynamically-held 'actively held high' nodes. Statically held nodes (with $V_{cc}$) can not be affected, in most cases. Degradation of refresh time in DRAM's is one of the results, because the capacitor holds charge dynamically. Similarly, degradation of CMOS digital images, in digital imaging IC's is another result of the havoc caused by minority carriers. Pixel and color resolution can be significantly enhanced in imaging IC's with the embodiments described here. Creating 'Sub Terrain' recombination centers underneath the wells (gold doping, platinum doping) as is done in some high-voltage diodes is not practical for VLSI circuits. Hence, a novel technique has been described here by creating a drift field to sweep these unwanted minority carriers into the substrate as quickly as possible, from the active circuitry at the surface. In a preferred embodiment, the subterrain n-layer has a graded donor concentration to sweep the minority carriers deep into the substrate. One or more of such layers can also be implemented through wafer to wafer bonding or similar "transfer" mechanisms. This n-layer can be a deeply-implanted layer. It can also be an epitaxial layer. The n-well and p-well also can be graded or retrograded in dopants, as desired, to sweep those carriers away from the surface as well. The graded dopant can also be implemented in surface channel MOS devices to accelerate majority carriers towards the drain. In nonvolatile memory devices, to decrease programming time, carriers should be accelerated towards the surface when programming of memory cells is executed. The graded dopant can also be used to fabricate superior Junction field-effect transistors where the "channel pinchoff" is controlled by a graded channel instead of a uniformly doped channel (as practiced in prior art).

One of ordinary skill and familiarity in the art will recognize that the concepts taught herein can be customized and tailored to a particular application in many advantageous ways. For instance, minority carriers can be channeled to the surface, to aid programming in nonvolatile memory devices (NOR, NAND, multivalued-cell). Moreover, single well, as well triple-well CMOS fabrication techniques can also be optimized to incorporate these embodiments, individually and collectively. Any modifications of such embodiments (described here) fall within the spirit and scope of the invention. Hence, they fall within the scope of the claims described below Although the invention has been described with reference to specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed is:

1. A semiconductor device comprising:
    a surface layer;
    a substrate;
    an active region including a source and a drain, disposed on one surface of said surface layer;
    a single drift layer disposed between the other surface of said surface layer and said substrate, said drift layer having a graded concentration of dopants generating a first static unidirectional electric drift field to aid the movement of minority carriers from said substrate to said surface layer; and
    at least one well region disposed in said single drift layer, said well region having a graded concentration of dopants generating a second static unidirectional electric drift field to aid the movement of minority carriers from said substrate to said surface layer.

2. The semiconductor device of claim 1 wherein said first and second static unidirectional electric fields are adapted to respective grading of dopants to aid movements of carriers in respective active regions.

3. The semiconductor device of claim 1 wherein the semiconductor device is a central processing unit (CPU).

4. The semiconductor device of claim 1 wherein the semiconductor device is a DRAM device.

5. The semiconductor device of claim 1 wherein the semiconductor device is a flash memory device.

6. The semiconductor device of claim 1 wherein the semiconductor device is an image sensor device.

7. A semiconductor device comprising:
    a surface layer;
    a substrate;
    an active region including a source and a drain, disposed on one surface of said surface layer;
    a single drift layer disposed between the other surface of said surface layer and said substrate, said drift layer having a graded concentration of dopants generating a first static unidirectional electric drift field to aid the movement of minority carriers from said surface layer to said substrate; and
    at least one well region disposed in said single drift layer, said well region having a graded concentration of dopants generating a second static unidirectional electric drift field to aid the movement of minority carriers from said surface layer to said substrate.

8. The semiconductor device of claim 7 wherein said first and second static unidirectional electric fields are adapted to respective grading of dopants to aid movements of carriers in respective active regions.

9. The semiconductor device of claim 7 wherein the semiconductor device is a central processing unit (CPU).

10. The semiconductor device of claim 7 wherein the semiconductor device is a DRAM device.

11. The semiconductor device of claim 7 wherein the semiconductor device is a flash memory device.

12. The semiconductor device of claim 7 wherein the semiconductor device is an image sensor device.

* * * * *